(12) United States Patent
Amoh et al.

(10) Patent No.: US 7,897,990 B2
(45) Date of Patent: Mar. 1, 2011

(54) SEMICONDUCTOR LIGHT EMITTING ELEMENT MOUNTING MEMBER, AND SEMICONDUCTOR LIGHT EMITTING DEVICE EMPLOYING IT

(75) Inventors: Teruo Amoh, Itami (JP); Sadamu Ishidu, Itami (JP); Kenjiro Higaki, Itami (JP); Yasushi Tsuzuki, Itami (JP); Hiroshi Fukuda, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 10/599,036

(22) PCT Filed: Feb. 22, 2005

(86) PCT No.: PCT/JP2005/002758
§ 371 (c)(1),
(2), (4) Date: Sep. 18, 2006

(87) PCT Pub. No.: WO2005/101533
PCT Pub. Date: Oct. 27, 2005

(65) Prior Publication Data
US 2007/0215895 A1    Sep. 20, 2007

(30) Foreign Application Priority Data
Apr. 12, 2004   (JP) ................... 2004-117180

(51) Int. Cl.
*H01L 33/00* (2010.01)
(52) U.S. Cl. .................. 257/99; 257/E33.056
(58) Field of Classification Search .............. 257/99, 257/E33.056
See application file for complete search history.

(56) References Cited

U.S. PATENT DOCUMENTS

| | | | |
|---|---|---|---|
| 6,689,498 B2* | 2/2004 | Shinosawa et al. | 428/698 |
| 2002/0171087 A1 | 11/2002 | Krames et al. | |
| 2004/0004435 A1* | 1/2004 | Hsu | 313/512 |
| 2004/0026708 A1* | 2/2004 | Chen | 257/99 |

(Continued)

FOREIGN PATENT DOCUMENTS

EP         1605523 A       12/2005

(Continued)

OTHER PUBLICATIONS

S. Wolf, Silicon Processing for the VLSI Era, 2000, vol. 1, pp. 104-107 & 434-437.*

(Continued)

*Primary Examiner* — Bradley K Smith
*Assistant Examiner* — Alexander Belousov
(74) *Attorney, Agent, or Firm* — Venable LLP; Michael A. Sartori; Justine A. Gozzi (57) ABSTRACT

A semiconductor light-emitting element mounting member with an improved effective light reflectivity in a metal film serving as an electrode layer and/or a reflective layer, in which the metal layer has improved adhesion to a substrate, mechanical strength, and reliability and superior light-emitting characteristics. The semiconductor light-emitting element mounting member (a submount) is made by forming on a substrate metal films formed from Ag, Al, or an alloy containing these metals. The particle diameter of the crystal grains of the metal films is no more than 0.5 μm and the center-line average roughness Ra of the surface is no more than 0.1 μm. In a semiconductor light-emitting device, a semiconductor light-emitting element is mounted in the submount.

12 Claims, 3 Drawing Sheets

U.S. PATENT DOCUMENTS

| | | |
|---|---|---|
| 2005/0067636 A1 | 3/2005 | Amoh et al. |
| 2005/0167679 A1 | 8/2005 | Ishii et al. |

FOREIGN PATENT DOCUMENTS

| | | |
|---|---|---|
| EP | 1605524 A | 12/2005 |
| JP | 06-017226 A | 1/1994 |
| JP | 07-243027 A | 9/1995 |
| JP | 09-293904 A | 11/1997 |
| JP | 2002-217456 A | 8/2002 |
| JP | 2002-232017 A | 8/2002 |
| JP | 2002-368020 | 12/2002 |
| JP | 2003-209286 A | 7/2003 |
| JP | 2003-258360 A | 9/2003 |
| JP | 2004-071675 A | 3/2004 |
| JP | 2004-079750 A | 3/2004 |
| JP | 2004-111618 A | 4/2004 |
| JP | 2004-296792 A | 10/2004 |
| JP | 2005-039194 A | 2/2005 |

OTHER PUBLICATIONS

Machine translation of JP-2003-209286, 13 pages.*

PCT International Preliminary Report on Patentability for PCT/JP2005/002758 mailed Mar. 1, 2007.

Song J O et al: "Low-resistance and highly-reflective Zn-Ni solid solution/Ag ohmic contacts for flip-chip light-emitting diodes" Applied Physics Letters AIP USA, vol. 83, No. 24, Dec. 15, 2003, pp. 4990-4992, XP002522288.

* cited by examiner

SEMICONDUCTOR LIGHT EMITTING ELEMENT MOUNTING MEMBER, AND SEMICONDUCTOR LIGHT EMITTING DEVICE EMPLOYING IT

CROSS-REFERENCE TO PRIOR APPLICATIONS

This application is a U.S. national phase application under 35 U.S.C. §371 of International Patent Application No. PCT/JP2005/002758, filed Feb. 22, 2005, and claims the benefit of Japanese Application No. 2004-117180, filed Apr. 12, 2004, both of which are incorporated by reference herein. The International Application was published in Japanese on Oct. 27, 2005 as International Publication No. WO 2005/101533 A1 under PCT Article 21(2).

TECHNICAL FIELD

The present invention relates to a semiconductor light-emitting element mounting member for mounting a semiconductor light-emitting element and a semiconductor light-emitting device with a semiconductor light-emitting element mounted in the semiconductor light-emitting element mounting member.

BACKGROUND ART

In order to improve the effective light-emission efficiency for semiconductor light-emitting devices, materials such as Ag and Al having superior light reflectivity are used to form an electrode layer for the mounting of an element and/or a reflective layer for reflecting light from the element on an element mounting surface or a reflection surface of a substrate of a semiconductor light-emitting element mounting member (e.g., see Japanese Laid-Open Patent Publication Number 9-293904 Claims 1, 2, sections 0015-0017, FIG. 1, FIG. 2, Japanese Laid-Open Patent Publication Number 2002-217456 sections 0013-0014, FIG. 1, FIG. 2, and Japanese Laid-Open Patent Publication Number 2002-232017 Claim 1, sections 0016-0021, FIG. 1).

While Ag, Al, and the like provide superior light reflectivity, the metal films actually formed on the element mounting surface, the reflective surface, or the like on the substrate do not provide adequate surface smoothness. This results in the irregular reflection of light and prevents a high effective reflectivity from being obtained.

In high-output semiconductor light-emitting devices with outputs of at least 1 W, which have undergone rapid development in recent years, high current flows make it necessary for the metal film used as the electrode layer to be thick so that the resistance can be lowered. However, with thicker metal films there is a greater tendency for the surface to be irregular. This prevents a high reflectivity from being obtained.

Also, this reduction in reflectivity is especially prominent with light having short wavelengths of no more than 450 nm in semiconductor light-emitting devices for ultraviolet emission and semiconductor light-emitting devices that emit white light in combination with a fluorescent material. The more uneven the metal film surface is, the more significant the reduction in effective reflectivity for light with short wavelengths is.

Furthermore, in recent years, the use of flip-chip mounting using Au bumps has become widespread as a method for mounting a semiconductor light-emitting element to a semiconductor light-emitting element mounting member. Flip-chip mounting involves a small contact area between the electrode layer of the semiconductor light-emitting element mounting member and the Au bumps. Thus, providing a practical degree of mounting strength, the adhesion of the metal layer serving as the electrode layer to the substrate must be improved and the mechanical strength of the metal layer itself must be increased.

Also, since Ag, Al, and the like are materials that tend to generate migration, a high degree of reliability cannot be provided in high-output semiconductor light-emitting devices that require high currents as described above.

Thus, a semiconductor light-emitting element mounting member with an improved effective light reflectivity in a metal film serving as an electrode layer and/or a reflective layer is desired.

Further, a semiconductor light-emitting element mounting member in which the metal layer has improved adhesion to a substrate, mechanical strength, and reliability is needed.

Additionally, a semiconductor light-emitting device with superior light-emitting characteristics using the semiconductor light-emitting element mounting member described above is desired.

SUMMARY OF THE INVENTION

In accordance with one embodiment of the invention a semiconductor light-emitting element mounting member includes a substrate, and a metal film formed on a surface of the substrate, formed from Ag, Al, or an alloy containing the metals, and functioning as an electrode layer for mounting a semiconductor light-emitting element and/or a reflective layer for reflecting light from a semiconductor light-emitting element. The crystal grains of the metal or alloy forming the metal film have a particle diameter along a surface plane of the metal film that are no more than 0.5 µm, and the surface of the metal film has a center-line average radius Ra of no more than 0.1 µm.

The invention may include an adhesion layer and a barrier layer ormed, in sequence, on the substrate, with the metal film being formed thereon.

The metal film may be formed as an alloy of Ag and/or Al and another metal, a proportional content of the other metal being 0.001-10 percent by weight.

The other metal may be least one type of metal selected from a group consisting of Cu, Mg, Si, Mn, Ti, and Cr.

A film thickness of the metal film can be 0.5-3 µm.

Additionally, the metal film can be formed from Al alone or from an alloy of Al and another metal.

In one embodiment of the invention a thermal expansion coefficient of the substrate is $1\times10^{-6}$/K-$10\times10^{-6}$/K, and a thermal conductivity of the substrate is at least 80 W/mK. Further, the semiconductor light-emitting element mounting member can be a flat submount.

The invention also includes a semiconductor light-emitting device wherein a semiconductor light-emitting element is mounted in the described semiconductor light-emitting element mounting member.

The semiconductor light-emitting device may have an output of at least 1 W.

As a result of the invention, the smoothness of the surface of the metal film can be improved.

More specifically, based on the shapes of the portions of the individual crystal grains of the metal or alloy forming the metal film exposed on the surface of the metal film, larger crystal grain particle diameters along the surface plane tend to increase unevenness of the surface. Also, the surface shape of the metal film is influenced by the surface shape of the underlying substrate, and greater surface roughness on the substrate tends to increase unevenness of the metal film surface. As the unevenness of the metal film surface increases, reflectivity decreases due to the tendency toward irregular reflection of light.

Accordingly, in one embodiment of the invention the individual crystal grains of the metal film have a particle diameter of no more than 0.5 μm along the plane of the metal film. This minimizes the unevenness of the metal film surface based on the shape of the portions exposed on the surface of the metal film. Also, by adjusting the substrate surface shape and the like to set the center-line average roughness Ra of the metal film surface to no more than 0.1 μm, the smoothness of the metal film surface can be improved and light reflectivity can be improved.

Thus, with the invention, it is possible to improve the effective light reflectivity, especially the reflectivity for light with short wavelengths of no more than 450 nm, of the metal film formed from Ag, Al, or an alloy containing these metals.

Further, an adhesion layer having superior adhesion with the material of the substrate, e.g., ceramic, may be formed on the substrate. On this adhesion layer a barrier layer may be formed for preventing dispersion of Ag and Al to the adhesion layer by preventing the reduction adhesion strength through the limiting of reactions between the Ag or Al forming the metal layer and the Ti or the like forming the adhesion layer resulting from thermal hysteresis (roughly no more than 300 deg C.) during post-processing, e.g., the mounting of the element. The metal film is formed on top of the barrier layer. As a result, adhesion of the metal film to the substrate can be improved.

Furthermore, the metal film can be formed from an alloy of Ag and/or Al and a predetermined proportion of another metal. This can improve mechanical strength. Use of an alloy can also prevent migration of Ag and Al. As a result, mechanical strength and reliability of the metal film can be improved.

As described above, the other metal in the alloy described above can be at least one type of metal selected from a group consisting of Cu, Mg, Si, Mn, Ti, and Cr.

Additionally, taking into account the need to use high current while maintaining the smoothness of the surface, it is preferable for the film thickness of the metal film to be 0.5-3 μm.

Also, if the structure is to be combined with a semiconductor light-emitting element that emits light with a short wavelength of no more than 400 nm, it would be preferable for the main metal forming the metal layer to be Al, which provides superior reflectivity for light with this type of short wavelength. Thus, it is preferable for the metal film to be formed from Al by itself or from an alloy of Al and another metal.

Taking into account the need to improve reliability of the semiconductor light-emitting device by reducing thermal strain generated by thermal hysteresis during the mounting of the semiconductor light-emitting element or during actual usage, it is preferable for the substrate to have a thermal expansion coefficient close to that of the semiconductor light-emitting element. More specifically, it is preferable for the thermal expansion coefficient of the substrate to be $1 \times 10^{-6}$/K-$10 \times 10^{-6}$/K.

It is also preferable, as described above, to improve heat dissipation to handle high-output semiconductor light-emitting devices by having the thermal conductivity of the substrate be at least 80 W/mK.

Furthermore, if the size of the submount is close to that of a light-emission section of the semiconductor light-emitting element, a semiconductor light-emitting device in which the semiconductor light-emitting element is mounted on the submount can be directly mounted in an inexpensive package or the like that conventionally involves directly mounting the semiconductor light-emitting element. Thus, a wide range of applications is available.

Also, since the semiconductor light-emitting device may be the semiconductor light-emitting element mounting member of the present invention described above, superior light emission characteristics can be provided. In particular, a semiconductor light-emitting device with super light emission characteristics can be provided with a device for ultraviolet light emission using a semiconductor light-emitting element that emits light with a short wavelength of no more than 450 nm or a device for white light emission by combining this semiconductor light-emitting element that emits light with a short wavelength and a fluorescent material.

Also, the structure of the semiconductor light-emitting device described above is suitable for a high-output device with an output of at least 1 W.

DETAILED DESCRIPTION OF THE PREFERRED EMBODIMENTS

Figure 1A:
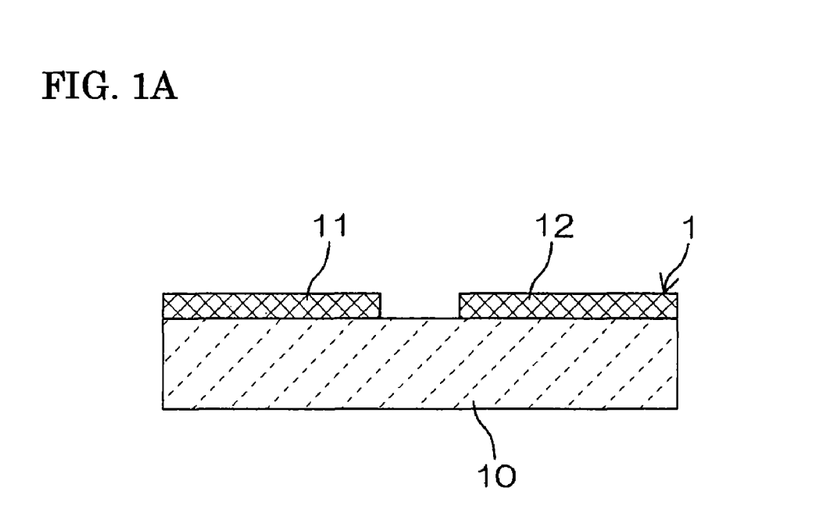
FIG. 1A is a cross-section drawing showing the structure of a submount according to an embodiment of the semiconductor light-emitting element mounting member in accordance with the present invention.
Figure 1B:
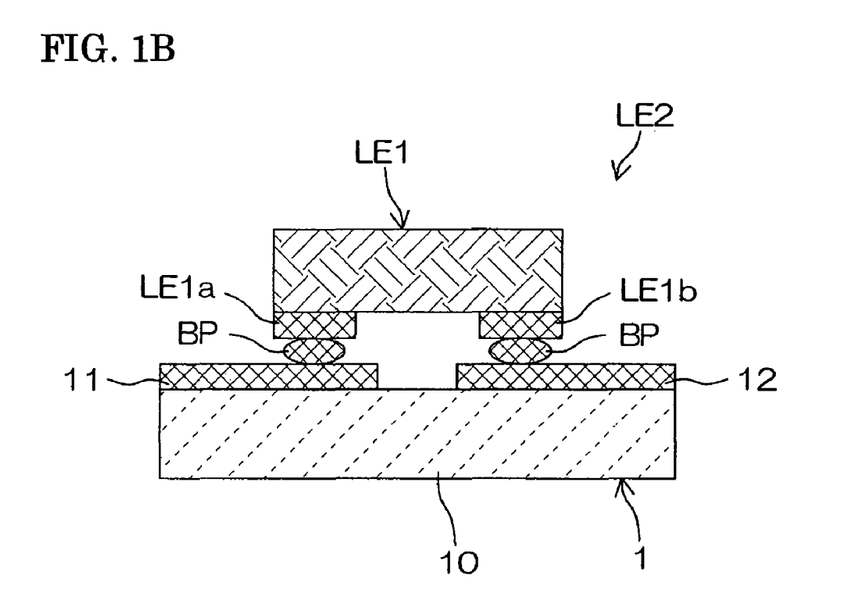
FIG. 1B is a cross-section drawing showing the structure of a semiconductor light-emitting device in which a semiconductor light-emitting element is flip-chip mounted on the submount.

FIG. 1A is a cross-section drawing of a submount 1 that is an embodiment of a semiconductor light-emitting element mounting member according to the present invention. FIG. 1B is a cross-section drawing showing a semiconductor light-emitting device LE2 in which a semiconductor light-emitting element LE1 is mounted on the submount 1.

As shown in these figures, the submount 1 of this example includes two metal layers 11, 12 provided on an upper surface side (according to the figure) of a flat substrate 10 and separated from each other by a narrow gap at the center of the surface plane, the metal layers 11, 12 serving as both an electrode layer for mounting the semiconductor light-emitting element LE1 and a reflective layer for reflecting light from the semiconductor light-emitting element.

The two metal layers 11, 12 correspond respectively to two electrodes LE1a, LE1b of the semiconductor light-emitting element LE1 and are bonded to the electrodes LE1a, LE1b by way of, e.g., Au bumps BP as shown in the figure. The semiconductor light-emitting element LE1 is flip-chip mounted on the submount 1 in this manner to form the semiconductor light-emitting device LE2.

The substrate 10 described above can be formed from any of various types of insulative material. However, taking into account the need to reduce thermal stress generated by thermal hysteresis from the mounting and usage of the semiconductor light-emitting element LE1 as described above, it is preferable for the thermal expansion coefficient of the material to be $1\times10^{-6}$/K-$10\times10^{-6}$/K as described above.

Also, taking into account the need to improve heat dissipation to handle high-output semiconductor light-emitting devices, it is preferable for the thermal conductivity of the substrate 10 to be at least 80 W/mK.

Examples of materials for the substrate 10 that meet these thermal expansion coefficient and thermal conductivity conditions include insulative ceramic such as AlN, $Al_2O_3$, SiC, $Si_3N_4$, BeO, BN, insulative Si, composite materials thereof, and the like. Of these, $Al_2O_3$ and insulative Si are preferable in terms of cost.

However, when heat dissipation is taken into account, it is more preferable for the thermal conductivity of the substrate 10 to be at least 120 W/mK, and yet more preferably at least 160 W/mK, and even more preferably at least 200 W/mK. To achieve these high thermal conductivity ranges, AlN or SiC can be used.

Also, in order to reduce the difference in thermal expansion coefficients with the semiconductor light-emitting element LE1 as much as possible, it is preferable for the thermal expansion coefficient of the substrate 10 to be $4\times10^{-6}$/K-$7\times10^{-6}$/K. To achieve this thermal expansion coefficient, AlN or $Al_2O_3$ may be used.

Thus, if thermal dissipation and the like are to be given priority to handle high-output semiconductor light-emitting devices, AlN may be used for the substrate 10. If heat dissipation is not especially important, $Al_2O_3$ and insulative Si may be used for the substrate 10.

To improve the smoothness and effective light reflectivity of the surfaces of metal films 11, 12, which form the submount 1 together with the substrate 10, the particle diameter along the surface plane of the crystal grains of the metal or alloy forming the metal films 11, 12 can be limited to no more than 0.5 µm. Also, the center-line average roughness of the surface of the metal films 11, 12 can be kept to an Ra of no more than 0.1 µm by adjusting the surface roughness of the substrate 10 or the like.

Figure 3A:
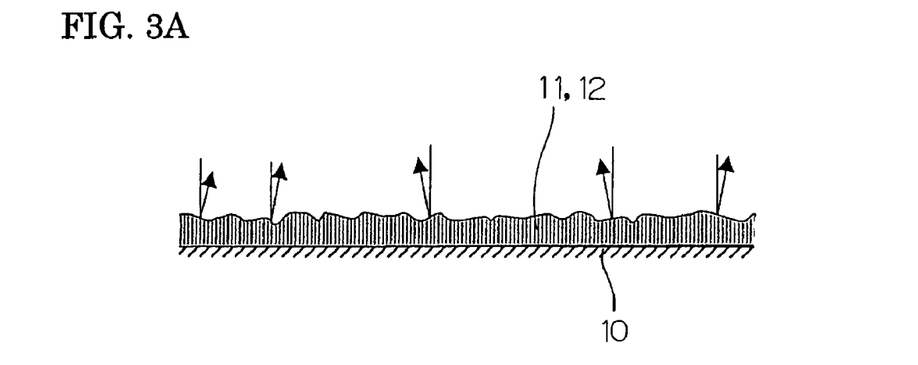
FIG. 3A is a cross-section drawing illustrating the relationship between irregular reflection of light and the size of surface unevenness determined from the shape of sections exposed crystal grains on the surface when the particle diameter of individual crystal grains forming a metal layer is no more than 0.5 μm.
Figure 3B:
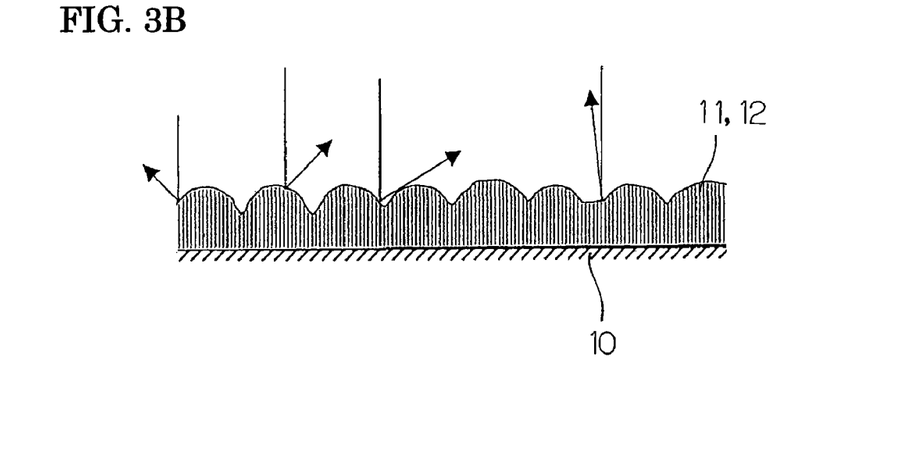
FIG. 3B is a cross-section drawing illustrating the relationship between irregular reflection of light and the size of surface unevenness determined from the shape of sections exposed crystal grains on the surface when the particle diameter of individual crystal grains forming a metal layer exceeds 0.5 μm.

As shown in FIG. 3B, if the particle diameter of the crystal grains exceeds 0.5 µm, the portions of individual crystal grains exposed on the surface of the metal films leads to increased unevenness of the surface of the metal films 11, 12 formed on the substrate 10, leading to a center-line average roughness for the surface exceeding an Ra of 0.1 µm. As the arrows in the figure indicate, this tends to result in irregular reflections and reduced reflectivity.

As shown in FIG. 3A, for example, if the particle diameter of the crystal grains is set to be no more than 0.5 µm as described above, the portions of the individual crystal grains exposed on the surface of the metal films minimizes the unevenness of the surfaces of the metal films 11, 12 formed on the substrate 10, making the surface smooth, i.e., keeping the center-line average roughness Ra of the surfaces of the metal films 11, 12 at no more than 0.1 µm. This limits irregular reflection of light as indicated by the arrows, and improves reflectivity.

In order to further improve light reflectivity by making the surfaces of the metal films 11, 12 smoother, it would be more preferable for the center-line average roughness Ra may be held to be no more than 0.05 µm, and even more preferably no more than 0.03 µm within the above range. To do this, the particle diameter of the crystal grains can be limited to no more than 0.3 µm and preferably no more than 0.1 µm within the above range.

If the metal films 11, 12 are formed through physical vapor deposition, e.g., vacuum vapor deposition or sputtering, the grain diameter of the crystal grains can be reduced by increasing the vapor deposition rate as much as possible or by lowering the substrate temperature as much as possible.

Figure 4A:
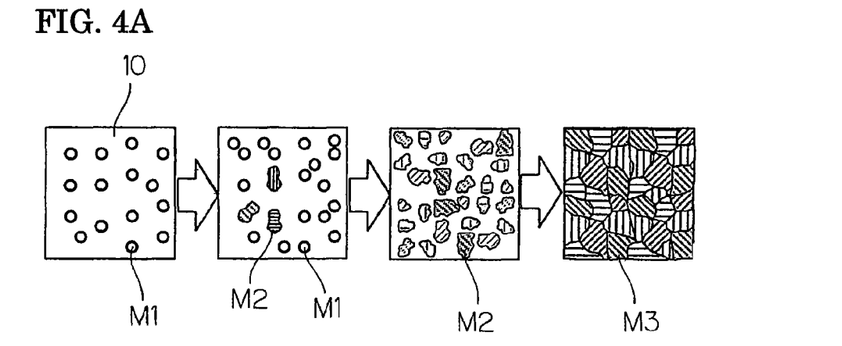
FIG. 4A is a drawing illustrating the formation of crystal grains at a high vapor deposition rate when a metal film is formed by physical vapor deposition.
Figure 4B:
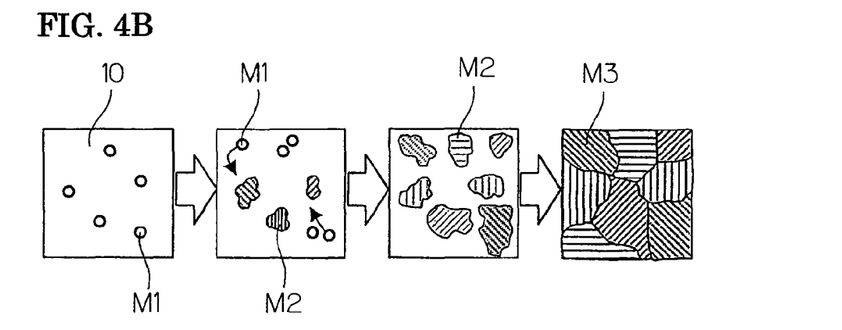
FIG. 4B is a drawing illustrating the formation of crystal grains at a low vapor deposition rate when a metal film is formed by physical vapor deposition.

Specifically, as shown in FIG. 4A, when physical vapor deposition is used and the vapor deposition rate is increased as much as possible when forming the metal films 11, 12, more metal particles M1 are formed on the surface of the substrate 10 during the initial vapor deposition stage compared to the use of a low vapor deposition rate shown in FIG. 4B. Each of the metal particles M1 grow individually into film-growth seeds M2 to form the metal films 11, 12. Thus, the particle diameter of the individual crystal grains M3 can be reduced.

Figure 5A:
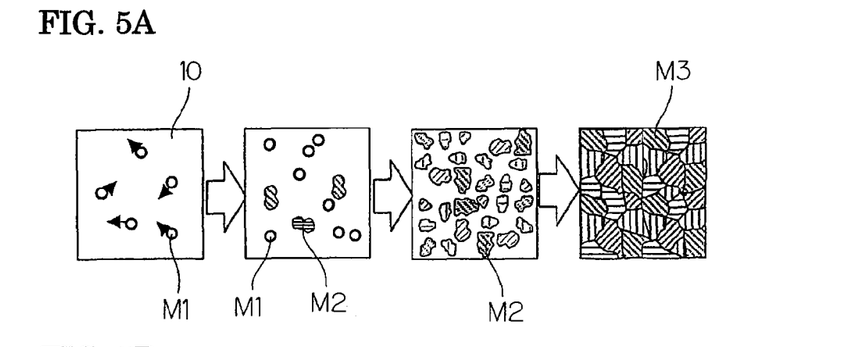
FIG. 5A is a drawing illustrating the formation of crystal grains at a low substrate temperature when a metal film is formed by physical vapor deposition.
Figure 5B:
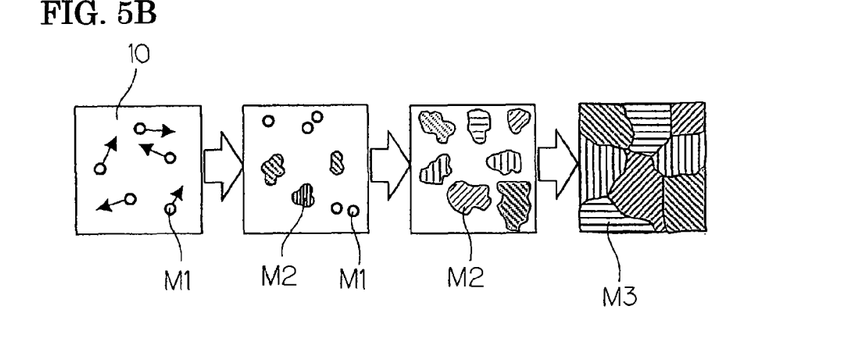
FIG. 5B is a drawing illustrating the formation of crystal grains at a high substrate temperature when a metal film is formed by physical vapor deposition.

Also, as shown in FIG. 6A, when physical vapor deposition is used and the substrate temperature is lowered as much as possible when forming the metal films 11, 12, in the initial vapor deposition stage, the seeds M2 grow and the metal films 11, 12 form with less of the movement, diffusion, and accompanying coalescing of multiple particles M1 indicated by the arrows in the figure of the metal particles M1, compared to FIG. 5B, where the substrate temperature is high. As a result, the particle diameter of the individual crystal grains M3 are smaller.

Thus, when physical vapor deposition is used to form the metal films 11, 12, a target particle diameter for the crystal grains can be achieved by adjusting conditions such as the vapor deposition rate and the substrate temperature while taking into account the type and surface state of the substrate 10 and the composition of the metal films 11, 12 to be formed.

While there are no special restrictions on specific values, as an example the vapor deposition rate may be at least 1.0 nm/s, preferably at least 1.5 nm/s, and more preferably at least 2.0 nm/s. Also, the substrate temperature may be 120 deg C., more preferably no more than 90 deg C., and more preferably no more than 60 deg C.

The particle diameter of the crystal grains forming the metal films 11, 12 can be determined using the following measurement method.

The surface of the formed metal films 11, 12 is photographed using a scanning electron microscope (SEM) or the like. Next, the number of crystal grains captured in a range having a predetermined area on the photo is calculated. Then, the predetermined area is divided by the number of crystal grains to obtain the average area per crystal grain. Based on this average area, the particle diameter is calculated assuming the planar shape of the crystal grains is circular.

Also, the center-line average roughness Ra of the surface of the metal films 11, 12 is influenced by the surface roughness of the underlying substrate 10 described above. Thus, if the surface roughness of the substrate 10 is high, it may not be possible to have the center-line average roughness Ra be no more than 0.1 μm even if the particle diameter of the crystal grains is within a range described above.

Thus, in order to have the center-line average roughness Ra of the surface of the metal films 11, 12 be no more than 0.1 μm, it is preferable to reduce the surface roughness as much as possible by abrading the surface of the substrate 10 or the like.

More specifically, it is preferable for the surface of the substrate 10 on which the metal films 11, 12 is to be formed to be abraded so that its center-line average roughness Ra is no more than 0.1 μm, preferably no more than 0.05 μm, and more preferably no more than 0.03 μm.

The center-line average roughness Ra of the surface of the metal films 11, 12 and the surface of the substrate 10 can be determined by applying "Definition and indication of surface roughness in Japan Industrial Standards JIS B0601$_{-1994}$ based on the surface shape as measured by conventionally known measurement methods.

The metal films 11, 12 having the characteristics described above are formed using Ag, Al, or an alloy thereof. More specifically, the metal films 11, 12 are formed from Ag by itself, Al by itself, an alloy of Al and another metal, or an alloy of Ag and Al and another metal.

Ag and/or Al can be used as the primary metal forming the metal films 11, 12, but if it is to be used in a semiconductor light-emitting element that emits light with short wavelengths of no more than 400 nm, it is preferable to use Al, which has superior characteristics especially for light with this type of short wavelength. Also, since Al is less expensive than Ag, the production cost of the submount 1 can be reduced.

As another metal used to form an alloy along with Ag and/or Al, it is possible to select at least one metal that improves the strength of the metal films 11, 12 and prevents Ag and Al migration out of a group consisting of: Cu, Mg, Si, Mn, Ti, and Cr.

It is preferable for the proportional content of the other metal to be 0.001-10 percent by weight.

If the proportional content of the other metal is less than 0.001 percent by weight, the improved strength of the metal films 11, 12 and the prevention of Ag and Al described above provided by including the other metal in the alloy may be inadequate. If the content exceeds 10 percent by weight, the proportional content of the Ag and/or Al is reduced, so that the reflectivity of the metal films 11, 12, especially for light with short wavelengths of no more than 450 nm, may be reduced.

In order to more reliably provide the advantages described above from the other metal, it is more preferable for the proportional content of the other metal to be at least 0.01 percent by weight and preferably at least 0.1 percent by weight, within the above range.

Also, in order to more reliably reduce light reflectivity, it is more preferable for the proportional content of the other metal to be no more than 5 percent by weight and even more preferably no more than 3 percent by weight, within the above range.

If two or more types of other metals are to be used together, the composition can be set up so that the total proportional content for all of these other metals together falls within the above ranges.

While there are no special restrictions to the light reflectivity of the metal films 11, 12, in order to further improve light emission efficiency for the semiconductor light-emitting device LE2 it is preferable, e.g., for light with a wavelength of 400 nm, to have a reflectivity of at least 70 percent, more preferably at least 80 percent, and even more preferably at least 90 percent. The reflectivity of light refers to values measured according to Japan Industrial Standards JIS Z8722$_{-2000}$, "Color measuring method—reflection color and transmission color".

Also, in order to reduce resistance to allow the semiconductor light-emitting device LE2 to handle high outputs, it is preferable for the metal films 11, 12 to have a film thickness of 0.5-3 μm.

If the film thickness is less than 0.5 μm, it is possible that the resistance of the metal films 11, 12 will not be low enough for the high current needed for a high-output semiconductor light-emitting device, e.g., with an output of at least 1 W. If the thickness exceeds 3 μm, the light reflectivity may be reduced even if the method described above is applied because it is not be possible to maintain the smoothness of the metal films 11, 12.

In order to adequately reduce the resistance to handle high outputs for the semiconductor light-emitting device LE2, it is more preferable for the film thickness of the metal films 11, 12 to be at least 0.8 μm, within the range described above.

In order to improve the smoothness of the surface of the metal films 11, 12, it is more preferable for the film thickness to be no more than 1.5 μm, within the range described above.

The metal films 11, 12 can be formed directly on the surface of the substrate 10. However, in order to improve adhesion to handle flip-chip mounting, it is preferable for an adhesion layer formed from Ti, Cr, NiCr, Ta, Cu, compounds thereof, or the like and having superior adhesion with the substrate 10 to be formed on the substrate 10, with the metal films 11, 12 being formed on top of this. It is also possible to interpose between the adhesion layer and the metal films 11, 12 a barrier layer formed from Pt, Pd, Ni, Mo, NiCr, Cu, or the like that prevents the diffusion of Ag, Al, or the like to the adhesion layer.

Also, it is preferable for the film thickness of the adhesion layer to be approximately 0.01-1.0 μm and the film thickness of the barrier layer to be approximately 0.01-1.5 μm.

Furthermore, it is also possible to form a solder barrier layer or a solder layer on the surface of the metal films 11, 12 for soldering the element.

Forming the patterns for the metal films 11, 12 and the layers above and below them can, for example, be performed by using a metal mask, a photolithography mask, or the like. Physical vapor deposition or the like as described above can then be performed to selectively metalize the exposed surface of the substrate 10 not covered by the mask.

As described above, it is better to for the mechanical strength and adhesive strength of the metal films 11, 12 to the substrate 10 to be high. For example, it is preferable for the die shear strength to be at least 10 MPa, more preferably at least 30 MPa. Also, taking flip-chip mounting into account, it is preferable for the ball shear strength to be at least 30 MPa, more preferably at least 60 MPa.

When a semiconductor light-emitting element is mounted using the flip-chip method, a high-luminance and highly reliable semiconductor light-emitting device is provided.

Die shear strength is measured according to MIL standards MIL-STD-883C METHOD 2019.4. More specifically, a chip is mounted on the metal films 11, 12. Using a tool based on a tension gauge, a side surface of the chip is pushed in a direction parallel to the plane of the metal films 11, 12. Die share strength is represented by the tension gauge value when the metal films 11, 12 peels off of the substrate 10. Ball shear strength is measured by ball bonding Au wire to the metal films 11, 12. A dedicated tension gauge is used to push the ball of a first bonding section from the side so that it slides. The ball shear strength is represented by the tension gauge value when the ball comes off. An Au wire with a diameter of 30 μm is wire bonded, and the ball shear strength is the value when the crushed ball diameter is 90 µm.

The submount 1 of the example shown in the figure formed from the elements described above can be made, e.g., by preparing a ceramic plate having the size of multiple units of the submount 1 and abrading one surface to a predetermined surface roughness. Then, patterns for the metal films 11, 12 and the layers above and below it for each submount 1 region are formed simultaneously for the entire ceramic plate. The ceramic plate is then diced to obtain the individual submounts 1.

With the semiconductor light-emitting device LE2 of the example shown in FIG. 1B, in which the semiconductor light-emitting element LE1 is flip-chip mounted on the submount 1 formed from the elements described above, the metal films 11, 12 provides superior light reflectivity. By forming the metal films 11, 12 with an alloy having predetermined proportions and forming an adhesion layer and barrier layer under them, it is possible to provide superior reliability, mechanical strength, and adhesion for the metal films 11, 12. This makes the structure suitable for high-output devices with outputs of at least 1 W, at least 2 W, and at least 5 W.

Also, in the semiconductor light-emitting element LE1, the submount 1 has a size that is similar to that of a light-emission section of the semiconductor light-emitting element LE1 described above. This makes it possible to mount the device directly in an inexpensive conventional package in which the semiconductor light-emitting element was directly mounted.

Figure 2:
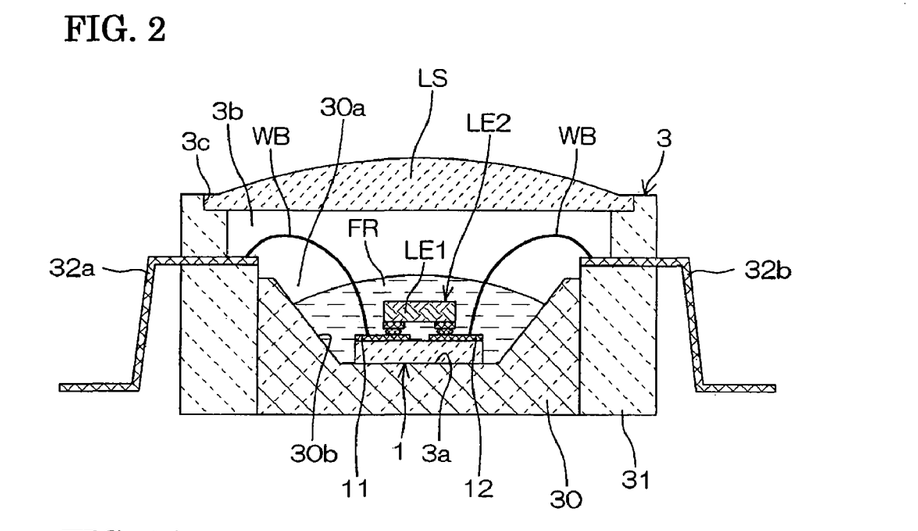
FIG. 2 is a cross-section drawing showing the semiconductor light-emitting device in accordance with the present invention mounted in a package.

FIG. 2 is a cross-section drawing showing the semiconductor light-emitting device LE2 mounted in a package 3 of this type.

In the example in the figure, the semiconductor light-emitting device LE2 is mounted in the package 3 in the following manner. An adhesive is used to adhere and secure the semiconductor light-emitting device LE2 to a mounting section 3a provided at a bottom surface of a cavity 3b of the package 3 facing an opening 3c. Next, the metal films 11, 12 is electrically connected to a pair of leads 32a, 32b provided on the package 3 by way of wire bonds WB, WB. The cavity 3b is filled with a fluorescent material and/or a protective resin FR, and the opening 3c is closed with a lens LS or a sealing cap formed from a material that can transmit light from the semiconductor light-emitting element LE1.

Also, the package 3 of the example in the figure is equipped with the mounting section 3a provided on the bottom surface, a reflective member 30 having a cavity 30a shaped like a bowl extending from the mounting section 3a and expanding outward toward the opening 3c, a cylindrical frame 31 bonded and formed integrally with the outer perimeter of the reflective member 30 with one end forming an opening 3c of the cavity 3b, and the leads 32a, 32b passed through the left and right sides (in the figure) of the frame 31. The inner surface of the cavity 30a forms a reflective surface 30b.

Light from the semiconductor light-emitting element LE1 is reflected by the reflective surface 30b toward the opening 3c, and is efficiently sent out from the package 3 by way of the lens LS.

In order to efficiently reflect the light from the semiconductor light-emitting element LE1, all or at least the reflective surface 30b of the reflective member 30 is metallic. In order to insulate the pair of leads 32a, 32b, the frame 31 is a resin or ceramic frame.

The structure of the present invention is not restricted to the example described above and shown in the figures.

For example, in the example shown in the figures, the metal films 11, 12 is connected to the leads 32a, 32b of the package 3 by way of the wire bonds WB. However, it is also possible to form the connections by providing electrode layers on the back surface of the submount 1 and the mounting section 3a of the package 3 and soldering the electrode layers. In this case, the metal films 11, 12 of the submount 1 and the electrode layers can be electrically connected, e.g., by using a via.

Also, the example in the figures is the submount 1 where the metal films 11, 12 serve as both an electrode layer for flip-chip mounting and a reflective layer. However, the semiconductor light-emitting element mounting member of the present invention is not restricted to this submount 1 and can also be a package in which the semiconductor light-emitting element is directly mounted or the like. In this case, the electrode layer and the reflective layer of the package can be formed as the metal film having the characteristics described for the present invention.

Also, if the metal film is to be used solely as a reflective layer without serving as an electrode layer, the restrictions described above for film thickness are not necessary. The film thickness for a metal film serving only as a reflective layer can be less than the range described above to allow further improvements in the smoothness of the surface.

Also, since strong adhesion is not required for a metal film serving only as a reflective layer, the metal film can be a single-layer structure.

Furthermore, since mechanical strength and reliability are not required for a metal film serving only as a reflective layer, the metal does not have to be an alloy and can be Ag and/or Al by itself or an alloy containing only Ag and Al.

Various other modifications may be effected on the design without departing from the scope of the present invention.

EXAMPLE

The present invention will be described below using examples and comparative examples.

First Example

Twenty substrates with a length of 50.8 mm, a width of 50.8 mm, and a thickness of 0.3 mm made from aluminum nitride (AlN) having a thermal conductivity of 230 W/mK and a thermal expansion coefficient of $4.5 \times 10^{-6}$/deg C. were prepared. Lap abrasion and polishing were performed on both surfaces (main surfaces) of the substrates to apply a finish with a center-line average roughness Ra of 0.02 µm.

Next, as shown in FIG. 1A, vacuum vapor deposition was performed on a first main surfaces of the substrate 10 to form two pure aluminum films 11, 12 insulated from each other by a narrow gap on the planar center to form a submount 1 serving as the semiconductor light-emitting element mounting member. Film formation was performed as follows. First, on the first main surface of the substrates 10 were formed, in the same planar shape as the pure aluminum films 11, 12, a titanium adhesion layer having a thickness of 0.1 µm and a platinum barrier layer having a thickness of 0.2 µm, in that order. On top of this were formed the pure aluminum films 11, 12 having a thickness of 2 µm. The film-forming conditions for the pure aluminum films 11, 12 were as follows: 50 deg C. substrate temperature; and 2.2 nm/s vapor deposition rate.

The mean particle diameter along the plane of the films of the aluminum crystal grains forming the pure aluminum films 11, 12 was measured using the method described above. Measurements were taken for all twenty substrates, and the mean value was found to be 0.05 µm. Also, the surface shape of the surfaces of the pure aluminum films 11, 12 were measured, and the center-line average roughness Ra was measured using the method described above. Measurements were taken for all twenty substrates, and the mean value for the center-line average roughness Ra was found to be 0.027 µm.

Also, the light reflectivity, the die shear strength, and the ball shear strength of the surface of the aluminum films 11, 12 were measured using the methods described above. For light reflectivity, measurements were taken for all twenty substrates and the mean measurement value was determined. For die shear strength and ball shear strength, measurements were taken for five substrates and the mean measurement value was determined. As a result, light reflectivity was found to be 95 percent, die shear strength was found to be 42 MPa, and ball shear strength was found to be 50 MPa.

Second Example

Film-forming conditions were similar to those from the first example except that the substrate temperature was set to 80 deg C. On the first main surface of the aluminum nitride substrates 10 were formed a titanium adhesion layer having a thickness of 0.1 µm and a platinum barrier layer having a thickness of 0.2 µm. On top of this were formed the pure aluminum films 11, 12 having a thickness of 2 µm, to form the submount 1.

The mean particle diameter along the plane of the films of the aluminum crystal grains forming the pure aluminum films 11, 12 was determined using the method described above and was found to be 0.20 µm. Also, the mean value of the center-line average roughness Ra was calculated and found to be 0.042 µm. Also, light reflectivity was 88 percent, the die shear strength was 45 MPa, and the ball shear strength was 52 MPa.

Third Example

Film-forming conditions similar to those from the first example except that the substrate temperature was set to 100 deg C. On the first main surface of the aluminum nitride substrates 10 were formed a titanium adhesion layer having a thickness of 0.1 µm and a platinum barrier layer having a thickness of 0.2 µm. On top of this were formed the pure aluminum films 11, 12 having a thickness of 2 µm, to form the submount 1.

Then, the mean particle diameter along the plane of the films of the aluminum crystal grains forming the pure aluminum films 11, 12 was determined using the method described above and was found to be 0.40 µm. Also, the mean value of the center-line average roughness Ra was calculated and found to be 0.085 µm. Also, light reflectivity was 75 percent, the die shear strength was 40 MPa, and the ball shear strength was 61 MPa.

First Comparative Example

Film-forming conditions were similar to those from the first example except that the substrate temperature was set to 130 deg C. On the first main surface of the aluminum nitride substrates 10 were formed a titanium adhesion layer having a thickness of 0.1 µm and a platinum barrier layer having a thickness of 0.2 µm. On top of this were formed the pure aluminum films 11, 12 having a thickness of 2 µm, to form the submount 1.

Then, the mean particle diameter along the plane of the films of the aluminum crystal grains forming the pure aluminum films 11, 12 was determined using the method described above and was found to be 0.70 µm. Also, the mean value of the center-line average roughness Ra was calculated and found to be 0.15 µm. Also, light reflectivity was 62 percent, the die shear strength was 43 MPa, and the ball shear strength was 62 MPa.

Fourth Example

Film-forming conditions were similar to those from the first example except that the vapor deposition rate was set to 1.2 nm/s. On the first main surface of the aluminum nitride substrates 10 were formed a titanium adhesion layer having a thickness of 0.1 µm and a platinum barrier layer having a thickness of 0.2 µm. On top of this were formed the pure aluminum films 11, 12 having a thickness of 2 µm, to form the submount 1.

Then, the mean particle diameter along the plane of the films of the aluminum crystal grains forming the pure aluminum films 11, 12 was determined using the method described above and was found to be 0.10 µm. Also, the mean value of the center-line average roughness Ra was calculated and found to be 0.035 µm. Also, light reflectivity was 90 percent, the die shear strength was 48 MPa, and the ball shear strength was 59 MPa.

Fifth Example

Film-forming conditions were similar to those from the first example except that the vapor deposition rate was set to 1.8 nm/s. On the first main surface of the aluminum nitride substrates 10 were formed a titanium adhesion layer having a thickness of 0.1 µm and a platinum barrier layer having a thickness of 0.2 µm. On top of this were formed the pure aluminum films 11, 12 having a thickness of 2 µm, to form the submount 1.

Then, the mean particle diameter along the plane of the films of the aluminum crystal grains forming the pure aluminum films 11, 12 was determined using the method described above and was found to be 0.35 µm. Also, the mean value of the center-line average roughness Ra was calculated and found to be 0.08 µm. Also, light reflectivity was 78 percent, the die shear strength was 41 MPa, and the ball shear strength was 50 MPa.

Second Comparative Example

Film-forming conditions were similar to those from the first example except that the vapor deposition rate was set to 0.7 nm/s. On the first main surface of the aluminum nitride substrates 10 were formed a titanium adhesion layer having a thickness of 0.1 µm and a platinum barrier layer having a thickness of 0.2 µm. On top of this were formed the pure aluminum films 11, 12 having a thickness of 2 µm, to form the submount 1.

Then, the mean particle diameter along the plane of the films of the aluminum crystal grains forming the pure aluminum films 11, 12 was determined using the method described above and was found to be 0.60 µm. Also, the mean value of the center-line average roughness Ra was calculated and found to be 0.12 µm. Also, light reflectivity was 66 percent, the die shear strength was 40 MPa, and the ball shear strength was 53 MPa.

Sixth Example

Film-forming conditions were similar to those from the first example except that finishing was performed on both sides of the aluminum nitride substrates 10 so that the center-line average roughness Ra was 0.04 µm. On the first main surface of the substrates 10 were formed a titanium adhesion layer having a thickness of 0.1 μm and a platinum barrier layer having a thickness of 0.2 μm. On top of this were formed the pure aluminum films 11, 12 having a thickness of 2 μm, to form the submount 1.

Then, the mean particle diameter along the plane of the films of the aluminum crystal grains forming the pure aluminum films 11, 12 was determined using the method described above and was found to be 0.07 μm. Also, the mean value of the center-line average roughness Ra was calculated and found to be 0.05 μm. Also, light reflectivity was 87 percent, the die shear strength was 43 MPa, and the ball shear strength was 60 MPa.

Seventh Example

Film-forming conditions were similar to those from the first example except that finishing was performed on both sides of the aluminum nitride substrates 10 so that the center-line average roughness Ra was 0.08 μm. On the first main surface of the substrates 10 were formed a titanium adhesion layer having a thickness of 0.1 μm and a platinum barrier layer having a thickness of 0.2 μm. On top of this were formed the pure aluminum films 11, 12 having a thickness of 2 μm, to form the submount 1.

Then, the mean particle diameter along the plane of the films of the aluminum crystal grains forming the pure aluminum films 11, 12 was determined using the method described above and was found to be 0.11 μm. Also, the mean value of the center-line average roughness Ra was calculated and found to be 0.09 μm. Also, light reflectivity was 75 percent, the die shear strength was 40 MPa, and the ball shear strength was 56 MPa.

Third Comparative Example

Film-forming conditions were similar to those from the first example except that finishing was performed on both sides of the aluminum nitride substrates 10 so that the center-line average roughness Ra was 0.15 μm. On the first main surface of the substrates 10 were formed a titanium adhesion layer having a thickness of 0.1 μm and a platinum barrier layer having a thickness of 0.2 μm. On top of this were formed the pure aluminum films 11, 12 having a thickness of 2 μm, to form the submount 1.

Then, the mean particle diameter along the plane of the films of the aluminum crystal grains forming the pure aluminum films 11, 12 was determined using the method described above and was found to be 0.15 μm. Also, the mean value of the center-line average roughness Ra was calculated and found to be 0.17 μm. Also, light reflectivity was 59 percent, the die shear strength was 45 MPa, and the ball shear strength was 52 MPa.

Eighth Example

The substrates 10 were prepared in a manner similar to the first example except that the substrates were formed from high thermal conductivity silicon carbide (SiC) with a thermal conductivity of 250 W/mK and a thermal expansion coefficient of $3.7 \times 10^{-6}$/deg C. and that lap abrasion and polishing were performed on both surfaces (main surfaces) of the substrates to apply a finish with a center-line average roughness Ra of 0.02 μm. On the first main surface of the high thermal conductivity silicon carbide substrate 10 were formed a titanium adhesion layer having a thickness of 0.1 μm and a platinum barrier layer having a thickness of 0.2 μm. On top of this were formed the pure aluminum films 11, 12 having a thickness of 2 μm, to form the submount 1.

Then, the mean particle diameter along the plane of the films of the aluminum crystal grains forming the pure aluminum films 11, 12 was determined using the method described above and was found to be 0.05 μm. Also, the mean value of the center-line average roughness Ra was calculated and found to be 0.028 μm. Also, light reflectivity was 94 percent, the die shear strength was 40 MPa, and the ball shear strength was 53 MPa.

Ninth Example

The substrates 10 were prepared in a manner similar to the first example except that the substrates were formed from high thermal conductivity silicon nitride ($Si_3N_4$) with a thermal conductivity of 90 W/mK and a thermal expansion coefficient of $3.0 \times 10^{-6}$/deg C. and that lap abrasion and polishing were performed on both surfaces (main surfaces) of the substrates to apply a finish with a center-line average roughness Ra of 0.02 μm. On the first main surface of the high thermal conductivity silicon nitride substrate 10 were formed a titanium adhesion layer having a thickness of 0.1 μm and a platinum barrier layer having a thickness of 0.2 μm. On top of this were formed the pure aluminum films 11, 12 having a thickness of 2 μm, to form the submount 1.

Then, the mean particle diameter along the plane of the films of the aluminum crystal grains forming the pure aluminum films 11, 12 was determined using the method described above and was found to be 0.05 μm. Also, the mean value of the center-line average roughness Ra was calculated and found to be 0.030 μm. Also, light reflectivity was 91 percent, the die shear strength was 47 MPa, and the ball shear strength was 48 MPa.

Tenth Example

The substrates 10 were prepared in a manner similar to the first example except that the substrates were formed from electrically insulative silicon (Si) with a thermal conductivity of 140 W/mK and a thermal expansion coefficient of $3.0 \times 10^{-6}$/deg C. and that lap abrasion and polishing were performed on both surfaces (main surfaces) of the substrates to apply a finish with a center-line average roughness Ra of 0.02 μm. On the first main surface of the high thermal conductivity silicon substrate 10 were formed a titanium adhesion layer having a thickness of 0.1 μm and a platinum barrier layer having a thickness of 0.2 μm. On top of this were formed the pure aluminum films 11, 12 having a thickness of 2 μm, to form the submount 1.

Then, the mean particle diameter along the plane of the films of the aluminum crystal grains forming the pure aluminum films 11, 12 was determined using the method described above and was found to be 0.05 μm. Also, the mean value of the center-line average roughness Ra was calculated and found to be 0.030 μm. Also, light reflectivity was 90 percent, the die shear strength was 48 MPa, and the ball shear strength was 52 MPa.

Eleventh Example

The substrates 10 were prepared in a manner similar to the first example except that the substrates were formed from a composite (Si—SiC) material formed by infiltrating 30 percent by volume of silicon (Si) into silicon carbide (SiC) with a thermal conductivity of 80 W/mK and a thermal expansion coefficient of $3.0 \times 10^{-6}$/deg C. and that lap abrasion and polishing were performed on both surfaces (main surfaces) of the substrates to apply a finish with a center-line average roughness Ra of 0.02 µm. On the first main surface of the composite material substrate 10 were formed a titanium adhesion layer having a thickness of 0.1 µm and a platinum barrier layer having a thickness of 0.2 µm. On top of this were formed the pure aluminum films 11, 12 having a thickness of 2 µm, to form the submount 1.

Then, the mean particle diameter along the plane of the films of the aluminum crystal grains forming the pure aluminum films 11, 12 was determined using the method described above and was found to be 0.05 µm. Also, the mean value of the center-line average roughness Ra was calculated and found to be 0.035 µm. Also, light reflectivity was 89 percent, the die shear strength was 45 MPa, and the ball shear strength was 50 MPa.

Twelfth Example

The substrates 10 were prepared in a manner similar to the first example except that the substrates were formed from a composite (Al—SiC) material formed by mixing and then mixing, melting and casting 70 percent by weight of high thermal conductivity silicon carbide powder used in the eighth example and 30 percent by weight of aluminum-magnesium alloy powder containing 0.3 percent by weight of magnesium, the result having a thermal conductivity of 180 W/mK and a thermal expansion coefficient of $8.0 \times 10^{-6}$/deg C. Lap abrasion and polishing were performed on both surfaces (main surfaces) of the substrates to apply a finish with a center-line average roughness Ra of 0.02 µm. On the first main surface of the composite material substrate 10 were formed a titanium adhesion layer having a thickness of 0.1 µm and a platinum barrier layer having a thickness of 0.2 µm. On top of this were formed the pure aluminum films 11, 12 having a thickness of 2 µm, to form the submount 1.

Then, the mean particle diameter along the plane of the films of the aluminum crystal grains forming the pure aluminum films 11, 12 was determined using the method described above and was found to be 0.05 µm. Also, the mean value of the center-line average roughness Ra was calculated and found to be 0.032 µm. Also, light reflectivity was 92 percent, the die shear strength was 40 MPa, and the ball shear strength was 58 MPa.

Thirteenth Example

The substrates 10 were prepared in a manner similar to the first example except that the substrates were formed from alumina ($Al_2O_3$) with a thermal conductivity of 20 W/mK and a thermal expansion coefficient of $6.5 \times 10^{-6}$/deg C. and that lap abrasion and polishing were performed on both surfaces (main surfaces) of the substrates to apply a finish with a center-line average roughness Ra of 0.02 µm. On the first main surface of the alumina substrate 10 were formed a titanium adhesion layer having a thickness of 0.1 µm and a platinum barrier layer having a thickness of 0.2 µm. On top of this were formed the pure aluminum films 11, 12 having a thickness of 2 µm, to form the submount 1.

Then, the mean particle diameter along the plane of the films of the aluminum crystal grains forming the pure aluminum films 11, 12 was determined using the method described above and was found to be 0.05 µm. Also, the mean value of the center-line average roughness Ra was calculated and found to be 0.026 µm. Also, light reflectivity was 80 percent, the die shear strength was 47 MPa, and the ball shear strength was 56 MPa.

Fourteenth Example

Twenty substrates with a length of 50.8 mm, a width of 50.8 mm, and a thickness of 0.3 mm made from aluminum nitride (AlN) having a thermal conductivity of 230 W/mK and a thermal expansion coefficient of $4.5 \times 10^{-6}$/deg C. were prepared. Lap abrasion and polishing were performed on both surfaces (main surfaces) of the substrates 10 to apply a finish with a center-line average roughness Ra of 0.02 µm.

Next, thin oxidation was applied to the entire surface of each of the substrates 10. Using vapor deposition directly on a first main surface, two pure aluminum films 11, 12 insulated from each other by a narrow gap on the planar center were formed to create the submount 1. The film-forming conditions for the pure aluminum films 11, 12 were as follows: 50 deg C. substrate temperature; and 2.2 nm/s vapor deposition rate.

Then, the mean particle diameter along the plane of the films of the aluminum crystal grains forming the pure aluminum films 11, 12 was determined using the method described above and was found to be 0.15 µm. Also, the mean value of the center-line average roughness Ra was calculated and found to be 0.040 µm. Also, light reflectivity was 88 percent, the die shear strength was 22 MPa, and the ball shear strength was 32 MPa.

The results described above are presented in Table 1 and Table 2.

TABLE 1

| | Substrate | | Film-forming conditions | | Characteristics of pure aluminum film | | | | |
|---|---|---|---|---|---|---|---|---|---|
| | Type | Ra (µm) | Substrate temperature (deg C.) | Vapor deposition rate (nm/s) | Mean particle diameter (µm) | Ra (µm) | Reflectivity (percent) | Die shear strength (MPa) | Ball shear strength (MPa) |
| First example | AlN | 0.02 | 50 | 2.2 | 0.05 | 0.027 | 95 | 42 | 50 |
| Second example | AlN | 0.02 | 80 | 2.2 | 0.20 | 0.042 | 88 | 45 | 52 |
| Third example | AlN | 0.02 | 100 | 2.2 | 0.40 | 0.085 | 75 | 40 | 61 |
| First comparative example | AlN | 0.02 | 130 | 2.2 | 0.70 | 0.15 | 62 | 43 | 62 |
| Fourth example | AlN | 0.02 | 50 | 1.2 | 0.10 | 0.035 | 90 | 48 | 59 |
| Fifth example | AlN | 0.02 | 50 | 1.8 | 0.35 | 0.08 | 78 | 41 | 50 |
| Second comparative example | AlN | 0.02 | 50 | 0.7 | 0.60 | 0.12 | 66 | 40 | 53 |
| Sixth example | AlN | 0.04 | 50 | 2.2 | 0.07 | 0.05 | 87 | 43 | 60 |

TABLE 1-continued

| | | Film-forming conditions | | | Characteristics of pure aluminum film | | | |
| --- | --- | --- | --- | --- | --- | --- | --- | --- |
| | Substrate | | Substrate temperature (deg C.) | Vapor deposition rate (nm/s) | Mean particle diameter (μm) | Ra (μm) | Reflectivity (percent) | Die shear strength (MPa) | Ball shear strength (MPa) |
| | Type | Ra (μm) | | | | | | | |
| Seventh example | AlN | 0.08 | 50 | 2.2 | 0.11 | 0.09 | 75 | 40 | 56 |
| Third comparative example | AlN | 0.15 | 50 | 2.2 | 0.15 | 0.17 | 59 | 45 | 52 |

TABLE 2

| | | Film-forming conditions | | | Characteristics of pure aluminum film | | | |
| --- | --- | --- | --- | --- | --- | --- | --- | --- |
| | Substrate | | Substrate temperature (deg C.) | Vapor deposition rate (nm/s) | Mean particle diameter (μm) | Ra (μm) | Reflecticity (percent) | Die shear strength (MPa) | Ball shear strength (MPa) |
| | Type | Ra (μm) | | | | | | | |
| Eighth example | SiC | 0.02 | 50 | 2.2 | 0.05 | 0.028 | 94 | 40 | 53 |
| Ninth example | $Si_3N_4$ | 0.02 | 50 | 2.2 | 0.05 | 0.030 | 91 | 47 | 48 |
| Tenth example | Si | 0.02 | 50 | 2.2 | 0.05 | 0.030 | 90 | 48 | 52 |
| Eleventh example | Si—SiC | 0.02 | 50 | 2.2 | 0.05 | 0.035 | 89 | 45 | 50 |
| Twelfth example | Al—SiC | 0.02 | 50 | 2.2 | 0.05 | 0.032 | 92 | 40 | 58 |
| Thirteenth example | $Al_2O_3$ | 0.02 | 50 | 2.2 | 0.05 | 0.026 | 80 | 47 | 56 |
| Fourteenth example | AlN | 0.02 | 50 | 2.2 | 0.15 | 0.040 | 88 | 22 | 32 |

Mounting Tests

As shown in FIG. 1B, the semiconductor light-emitting devices LE2 were formed with the submounts 1 made according to the examples and comparative examples described above by bonding the pure aluminum films 11, 12 to the two electrodes LE1a, LE1b of the semiconductor light-emitting element LE1 with Au bumps BP, with the semiconductor light-emitting element LE1 flip-chip mounted on the submount 1.

Ten semiconductor light-emitting devices LE2 were prepared for each example and comparative example, and these were mounted in the package 3 shown in FIG. 2 and the light emission efficiency (lm/W) was measured. The submounts 1 of the examples all provided high light emission efficiencies of 90-100 percent of the highest light emission efficiency of the first example. However, when the submounts 1 of the comparative examples were used, all of them provided low light emission efficiency of less than 90 percent of the light emission efficiency of the first example.

Results showing roughly the same tendencies were obtained when the preparation of samples and testing described above when the metal film was silver film, casting alloy film in which 1 percent by weight of copper was added to silver, and casting alloy film in which 1 percent by weight of silicon was added to aluminum.

The invention claimed is:

1. A semiconductor light-emitting element mounting member comprising:
a substrate; and
a metal film formed on a surface of said substrate, formed from Ag alone, and functioning as an electrode layer for mounting at least one of a semiconductor light-emitting element and a reflective layer for reflecting light from a semiconductor light-emitting element wherein:
the thickness of the metal film is 0.5-3 μm;
crystal grains of said Ag forming said metal film have a particle diameter along a surface plane of said metal film of no more than 0.5 μm;
said surface of said metal film has a center-line average roughness Ra of no more than 0.1 μm;
an adhesion layer and a barrier layer are formed, in sequence, on said substrate, with said metal film being formed on said barrier layer;
the thickness of the adhesion layer is 0.01-1.00 μm; and
the thickness of the barrier layer is 0.01-1.50 μm.

2. A semiconductor light-emitting element mounting member comprising:
a substrate; and
a metal film formed on a surface of said substrate, formed from at least one of Ag alloy or Al alloy, wherein the Ag alloy or the Al alloy includes other metal, a proportional content of said other metal being 0.001-5 percent by weight, said metal film functioning as an electrode layer for mounting at least one of a semiconductor light-emitting element and a reflective layer for reflecting light from a semiconductor light-emitting element wherein:
the thickness of the metal film is 0.5-3 μm;
crystal grains of said Ag alloy or Al alloy forming said metal film have a particle diameter along a surface plane of said metal film of no more than 0.5 μm;
said surface of said metal film has a center-line average roughness Ra of no more than 0.1 μm;
an adhesion layer and a barrier layer are formed, in sequence, on said substrate, with said metal film being formed on said barrier layer;
the thickness of the adhesion layer is 0.01-1.00 μm; and
the thickness of the barrier layer is 0.01-1.50 μm.

3. The semiconductor light-emitting element mounting member according to claim 2 wherein said other metal is at least one type of metal selected from a group consisting of Cu, Mg, Si, Mn, and Ti.

4. The semiconductor light-emitting element mounting member according to claim 1 wherein a thermal expansion coefficient of said substrate is $1\times10^{-6}$/K-$10\times10^{-6}$/K.

5. The semiconductor light-emitting element mounting member according to claim 1 wherein a thermal conductivity of said substrate is at least 80 W/mK.

6. The semiconductor light-emitting element mounting member according to claim 1 wherein said semiconductor light-emitting element mounting member is a flat submount.

7. A semiconductor light-emitting device, comprising:
- the semiconductor light-emitting element mounting member of claim 1; and
- a semiconductor light-emitting element mounted in said semiconductor light-emitting element mounting member.

8. The semiconductor light-emitting device according to claim 7 wherein the output of said semiconductor light-emitting element is at least 1 W.

9. The semiconductor light-emitting mounting member according to claim 1 wherein said substrate is an insulative ceramic.

10. The semiconductor light-emitting mounting member according to claim 9 wherein the insulative ceramic is selected from a group consisting of AlN, $Al_2O_3$, SiC, $Si_3N_4$, BeO, BN, and insulative Si.

11. A semiconductor light-emitting element mounting member comprising:
- a substrate; and
- a metal film formed on a surface of said substrate, formed from Al alone, and functioning as an electrode layer for mounting at least one of a semiconductor light-emitting element and a reflective layer for reflecting light from a semiconductor light-emitting element wherein:
- the thickness of the metal film is 0.5-3 μm;
- crystal grains of said Al forming said metal film have a particle diameter along a surface plane of said metal film of no more than 0.5 μm;
- said surface of said metal film has a center-line average roughness Ra of no more than 0.1 μm;
- an adhesion layer and a barrier layer are formed, in sequence, on said substrate, with said metal film being formed on said barrier layer;
- the thickness of the adhesion layer is 0.01-1.00 μm; and
- the thickness of the barrier layer is 0.01-1.50 μm.

12. A device to mount a semiconductor light-emitting element comprising:
- a substrate; and
- a pair of metal films formed on a surface of said substrate, formed from Ag by itself, Al by itself, an Al alloy comprising primarily Al, or an Ag alloy comprising primarily Ag, adapted to have the semiconductor light-emitting element mounted thereon and adapted to reflect light emitted by the semiconductor light-emitting element mounted thereon,
- wherein the pair of metal films are separated by a gap above the substrate, wherein the pair of metal films are adapted to have the semiconductor light-emitting element mounted above the gap;
- wherein:
  - the thickness of the metal film is 0.5-3 μm;
  - crystal grains of said Ag by itself, Al by itself, Al alloy comprising primarily Al, or Ag alloy comprising primarily Ag forming said metal film have a particle diameter along a surface plane of said metal film of no more than 0.5 μm;
  - said surface of said metal film has a center-line average roughness Ra of no more than 0.1 μm;
  - an adhesion layer and a barrier layer are formed, in sequence, on said substrate, with said metal film being formed on said barrier layer;
  - the thickness of the adhesion layer is 0.01-1.00 μm; and
  - the thickness of the barrier layer is 0.01-1.50 μm.

* * * * *